(12) United States Patent
Shifren et al.

(10) Patent No.: US 7,566,605 B2
(45) Date of Patent: Jul. 28, 2009

(54) EPITAXIAL SILICON GERMANIUM FOR REDUCED CONTACT RESISTANCE IN FIELD-EFFECT TRANSISTORS

(75) Inventors: Lucian Shifren, Hillsboro, OR (US); Jack T. Kavalieros, Portland, OR (US); Steven M. Cea, Hillsboro, OR (US); Cory E. Weber, Hillsboro, OR (US); Justin K. Brask, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 402 days.

(21) Appl. No.: 11/395,939

(22) Filed: Mar. 31, 2006

(65) Prior Publication Data
US 2007/0231983 A1    Oct. 4, 2007

(51) Int. Cl.
H01L 21/8238    (2006.01)
H01L 21/425    (2006.01)

(52) U.S. Cl. .................. 438/199; 438/197; 438/514; 438/517; 438/524

(58) Field of Classification Search ............ 438/197, 438/199, 514, 517, 524; 257/510
See application file for complete search history.

(56) References Cited

U.S. PATENT DOCUMENTS

| | | | |
|---|---|---|---|
| 5,155,571 A * | 10/1992 | Wang et al. ............... 275/19 |
| 6,066,520 A * | 5/2000 | Suzuki ............... 438/202 |
| 6,717,216 B1 | 4/2004 | Doris et al. |
| 6,825,086 B2 | 11/2004 | Lee et al. |
| 6,838,728 B2 | 1/2005 | Lochtefeld et al. |
| 6,906,393 B2 | 6/2005 | Sayama et al. |
| 6,949,482 B2 | 9/2005 | Murthy et al. |
| 2004/0126965 A1 * | 7/2004 | Krueger et al. ............ 438/255 |
| 2004/0157353 A1 * | 8/2004 | Ouyang et al. ............ 438/38 |
| 2004/0259315 A1 * | 12/2004 | Sakaguchi et al. ........ 438/285 |
| 2005/0026342 A1 * | 2/2005 | Fung et al. ............... 438/197 |
| 2005/0148148 A1 * | 7/2005 | Cheng ............... 438/299 |
| 2005/0156274 A1 * | 7/2005 | Yeo et al. ............... 257/510 |
| 2007/0155063 A1 | 7/2007 | Datta et al. |

OTHER PUBLICATIONS

PCT Int'l Search Report for PCT/US2007/007707, dated Sep. 4, 2007, 3 pages.

\* cited by examiner

*Primary Examiner*—Ha Tran T Nguyen
*Assistant Examiner*—Karen M Kusumakar
(74) *Attorney, Agent, or Firm*—Blakely, Sokoloff, Taylor & Zafman LLP

(57) ABSTRACT

A method for selectively relieving channel stress for n-channel transistors with recessed, epitaxial SiGe source and drain regions is described. This increases the electron mobility for the n-channel transistors without affecting the strain in p-channel transistors. The SiGe provides lower resistance when a silicide is formed.

8 Claims, 2 Drawing Sheets

EPITAXIAL SILICON GERMANIUM FOR REDUCED CONTACT RESISTANCE IN FIELD-EFFECT TRANSISTORS

FIELD OF THE INVENTION

The invention relates to the field of silicon germanium regions in field-effect transistors.

PRIOR ART AND RELATED ART

Frequently in semiconductor devices, a silicide metal is formed on semiconductor regions to reduce resistance. At the interface between the silicide and a semiconductor, such as silicon, a Shottkey barrier is a source of resistance. This can be reduced by lowering the bandgap, as occurs when silicon germanium (SiGe) is used as the material in which the silicide or salicide is formed. The use of SiGe source and drain regions and a nickel silicide metal is described in U.S. Pat. No. 6,949,482. The bandgap diagrams and related text in this patent describe the advantages of using, particularly nickel silicide, on the SiGe. (See FIGS. 5, 6 and 7 and related text.)

It is recognized that improved performance in PMOS transistors is obtained when a uniaxial compressive strain is imparted directly to the channel region of the transistor from, for instance, embedded SiGe source and drain regions. Similarly, it is known that increased performance is obtained in NMOS transistors when uniaxial tensile strain is placed on its channel. This is described in "A Tensile Strained NMOS Transistor Using Group III-N Source/Drain Regions," application Ser. No. 11/323,688, filed Dec. 29, 2005,assigned to the assignee of the present application.

DETAILED DESCRIPTION

A method is described for fabricating p-channel and n-channel transistors where a silicon germanium (SiGe) source and drain regions are used and where a silicide is formed on these regions. In the following description, numerous specific details are set forth such as implantation energy levels, etc. in order to provide a thorough understanding of the present invention. It will be apparent to one skilled in the art, that the present invention may be practiced without these specific details. In other instances, well-known fabrication processes are not described in detail in order not to unnecessarily obscure the present invention.

Figure 1:
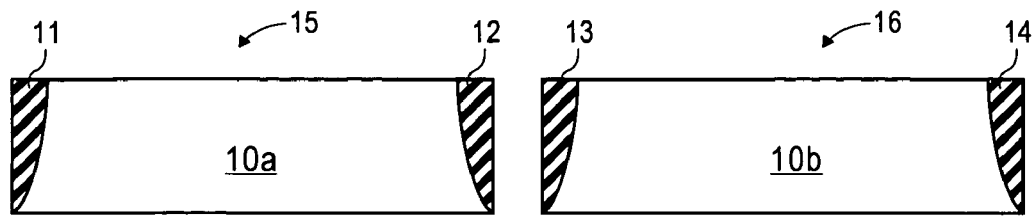
FIG. 1 is a cross-sectional, elevation view of two sections of an upper portion of a silicon substrate in which isolation trenches are formed.

In FIG. 1, the upper portion of a monocrystalline silicon substrate is shown. Two separate sections of the substrate identified as 10a and 10b are illustrated. On section 10a, as will be described, an n-channel transistor is formed in the region 15. On the substrate section 10b, a p-channel transistor is fabricated in the region 16. The region 15 is bounded by the two isolation trenches 11 and 12. Similarly, the region 16 is bounded by the isolation trenches 13 and 14. The trenches 11-14 are shallow isolation trenches formed by etching the upper region of the substrate and filling the trenches with a dielectric. In some cases, after the trenches are etched, a silicon dioxide is grown to form a dielectric liner within the trenches. Then, the trenches can be filled with a material such as a deposited silicon dioxide.

In FIG. 1, only half a trench is shown for each of the four trenches 11-14. In some of the embodiments described below, as will be discussed, material filling the trench is etched. In some cases the material is etched across the entire trench, and in other cases it is etched from less than the entire width of the trench. The trench widths as shown in the drawings are not-to-scale, for instance, relative to the gate structure. For convenience, the trenches are shown to be much narrower relative to the gate structure than they are in an integrated circuit.

Gate structures are formed on the regions 15 and 16 and like regions of the substrate. Each resultant gate structure, shown in FIG. 2, includes a gate dielectric 21 separating a gate 20 from a channel region in the substrate, and a hard mask 23 over the gate 20. Sidewall spacers 22 are disposed on opposite sides of the gates 20. Processing steps such as the n-type and p-type dopant tip implants, and the formation of the sidewall spacers, are not described here. These steps are known in the prior art. Moreover, the specific gate structure shown is by way of example and not critical to the present invention.

Figure 2:
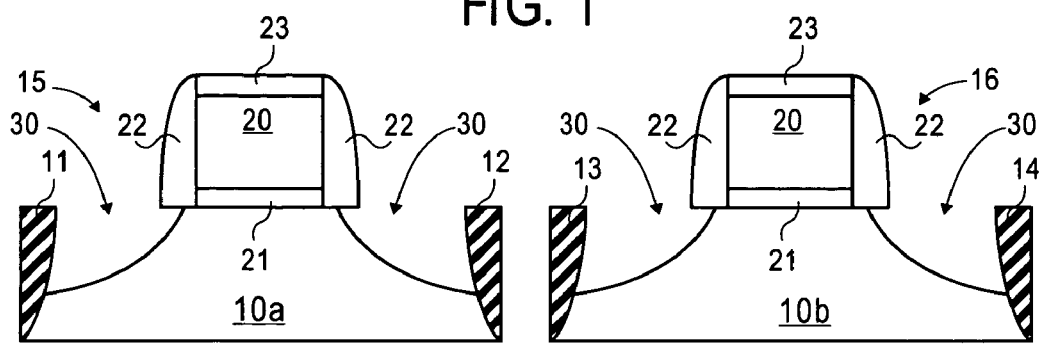
FIG. 2 illustrates the structure of FIG. 1, with gate structures and with recesses etched into the silicon, adjacent the gate structures.
Figure 3:
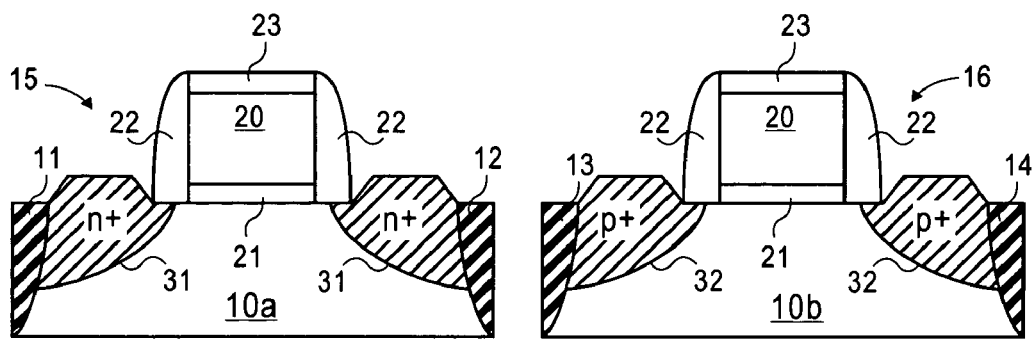
FIG. 3 illustrates the structure of FIG. 2, after SiGe source and drain regions are grown in the recesses.

After the gate structures are formed, recesses 30 are etched into the silicon substrate at the sites of the source and drain regions for both the n-channel and p-channel transistors. In FIG. 2 the recesses 30 extend approximately from the gate structure to an isolation trench. Note the recesses 30 in each case extends slightly under the spacers, and are bounded by an isolation trench.

Now, epitaxial growth is used to grow SiGe source and drain regions for both the n-channel and p-channel transistors. The source and drain regions may be raised above the original level of the substrate, as illustrated. Note these regions are immediately adjacent to the isolation trenches.

The growing of the SiGe in the recesses causes compressively strained channel regions for both the n-channel and p-channel transistors. In the case of the p-channel transistor, this strain is beneficial in that it improves hole mobility in the transistor. Unfortunately, in the case of the n-channel transistor, the same strain degrades electron mobility. Both the n-channel and p-channel transistors, however, will benefit from the lower silicide barrier height associated with the SiGe, once the silicide or salicide is formed.

Figure 4:
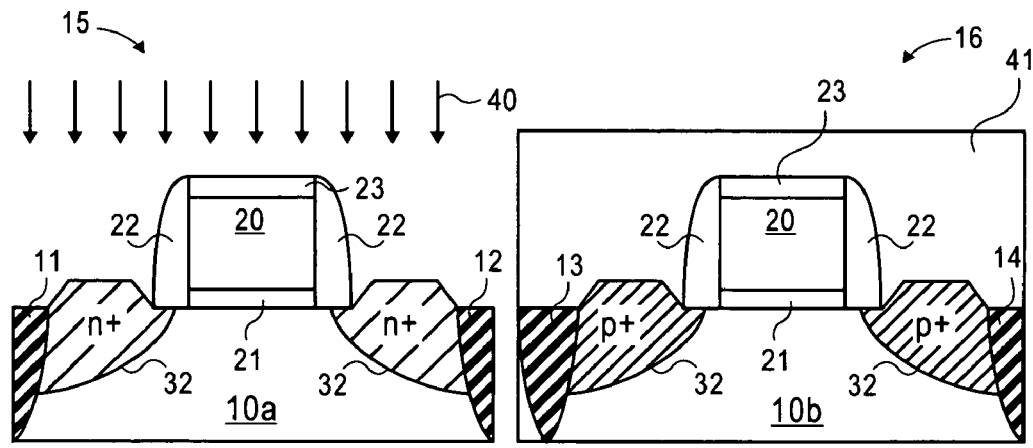
FIG. 4 illustrates the structure of FIG. 3, after masking a p-channel transistor and during an ion implantation of the n-channel transistor.

FIG. 4 illustrates one process for relieving the strain on the channel region of the n-channel transistor while leaving the strain on the p-channel transistor. First, a masking member, which may be photoresist 41, is formed over the p-channel transistors, covering the source and drain regions of these transistors. Then, as shown in FIG. 4, ions 40 are implanted into the SiGe source and drain regions of the n-channel transistor to create dislocation defects that act as relaxation sites within the SiGe. This reduces the strain on the channel region, and consequently, improves the electron mobility in the channel region. The ion bombardment may be relatively shallow since the channel region of the n-channel transistor is near the surface of the silicon (directly below the gate insulator), thus, there is no need to disrupt the crystal lattice deep within the recesses. The ions which are implanted are not nominally charge carriers, and therefore do not affect the semiconductor properties of the source and drain regions. Carbon, for instance, may be used. Implantation energy levels of 0.5-1.5Kev are adequate, with a dose of approximately 1E16-5E16 atoms/cm$^2$.

Following this implantation, a silicide is formed in an ordinary manner, such as with nickel. The disruption to the lattice of the n-channel source and drain regions, assists in the formation of the silicide, when compared to the source and drain regions of the p-channel transistor.

As shown in FIG. 4, the entire isolation trench 13 is included under the mask, whereas only half the isolation trench 14 is under the mask 41. This is to demonstrate that the alignment of the mask with the isolation regions is not critical for this embodiment. What matters is that the SiGe source and drain regions of the p-channel transistor are protected from the implantation.

Figure 5:
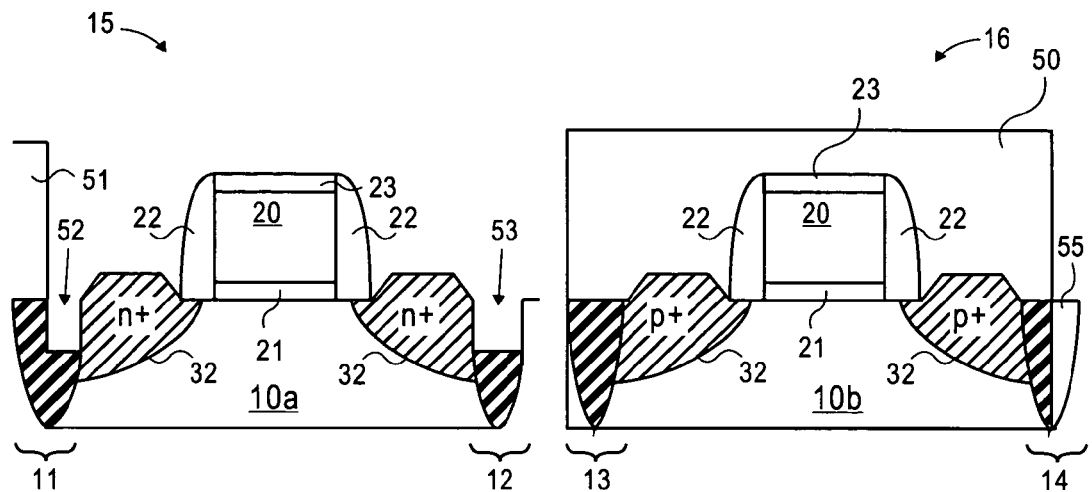
FIG. 5 illustrates the structure of FIG. 3, in alternate processing, where after a masking step, some of the material in the isolation trenches is etched.

In an alternate embodiment, the stress in the n-channel transistors is relieved by removing some, or all, of the material in the isolation trenches. Referring to FIG. 5, again, a masking member (member 50) is placed over the p-channel transistors. The trenches bounding the n-channel transistors, such as trenches 11 and 12 of FIG. 5, are exposed, at least in part. Then, the material in the trenches, such as the silicon dioxide, is etched out of the trench with either an isotropic or anisotropic etching process. As shown by the openings 52 and 53 of FIG. 5, not all the material in the bottom of the trench needs to be etched. Only the strain in the channel regions, which is near the surface, needs to be relieved.

Where an isolation trench separates an n-channel transistor from a p-channel transistor, etching the entire width of the trench, may cause the relieving of strain in both the p-channel and n-channel transistor. This would eliminate one of the benefits of using SiGe in the p-channel transistor, specifically the higher hole mobility created by the strained channel.

In this case, the masking member should prevent the entire trench from being etched. For instance, masking member 51 of FIG. 5 protects a portion of the material in the trench 11. Similarly, masking member 50 protects part of trench 14. The masks 50 and 51 prevent all the material filling the trench 14 and 11, respectively, from being etched away particularly if an anisotropic etchant is used. Consequently, if a p-channel transistor is disposed on the side of the isolation region 11 opposite the n-channel transistor shown in FIG. 5, the strain in its channel will not be relieved. Similarly, the opening 55 would relive the strain from an n-channel transistor disposed on the side of trench 14 opposite region 16. Where a p-channel transistor does not share a isolation trench with an n-channel transistor, or where for some reason the entire trench can be etched, the masking member need not fall on the trench. This is shown by trench 12 in FIG. 5.

Figure 6:
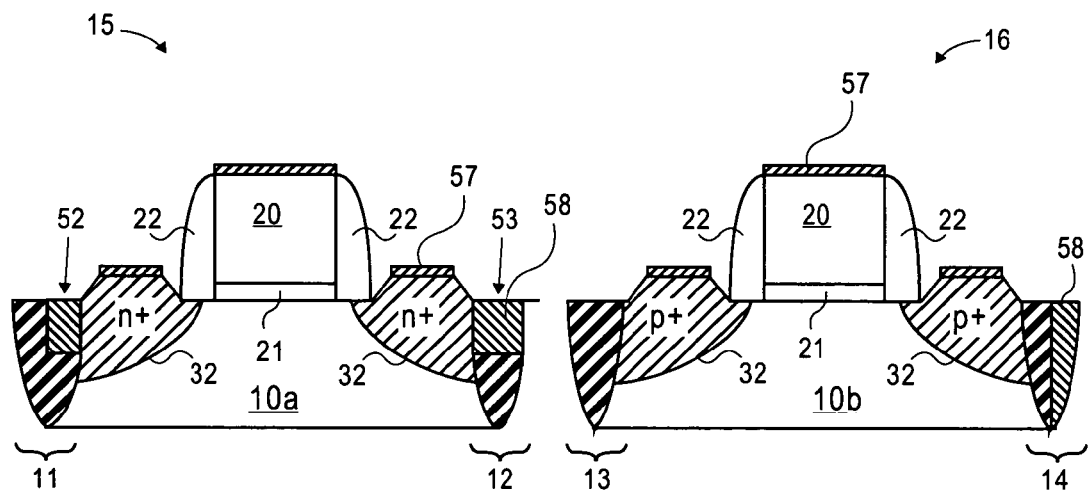
FIG. 6 illustrates the structure of FIG. 5 after a silicide is formed on the source and drain regions.

As illustrated in FIG. 6, once the strain has been relieved from the channel regions of the n-channel transistors, a silicide 57 may be formed on the SiGe surfaces. Subsequently, the trenches are re-filled with, for instance, an interlayer dielectric (ILD). This re-filling of the trenches does not create strain on the channels. Note in FIG. 6 the openings 52 and 53 have been re-filled with a dielectric 58.

Figure 7:
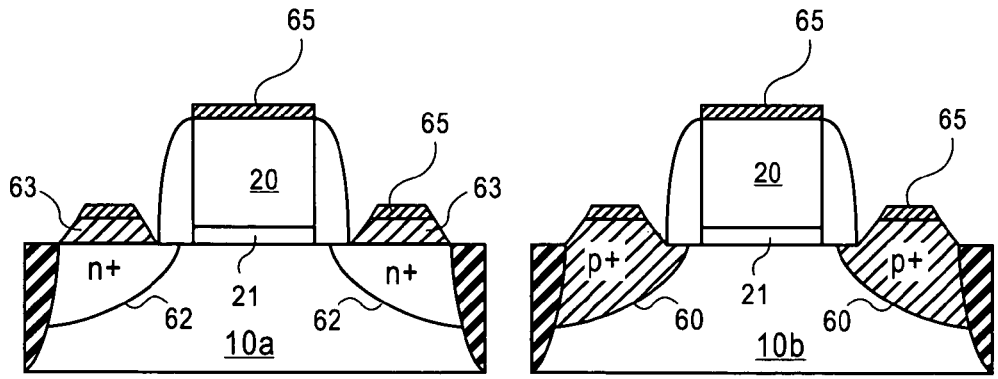
FIG. 7 illustrates another embodiment, where for the n-channel transistor, the SiGe is not recessed.

In FIG. 7, an additional embodiment is illustrated. Recesses are not formed for the n-channel transistors, but rather the silicon is doped as shown by the source and drain regions 62 for the n-channel transistor on the substrate section 10a. Recesses, such as shown in FIG. 2, for the p-channel transistors, are etched for the embodiment of FIG. 7. Then, the SiGe is epitaxially grown, forming the regions 60 for the p-channel transistor, and the regions 63 for the n-channel transistor. The regions 63 are above the level of the channel region, and as a result do not cause strain on the channel region of the n-channel transistor. Again, as was the case in the other embodiments, silicide 65 is formed on the SiGe surfaces. The advantage gained in the other embodiments of lowering the silicon/silicide resistance is therefore obtained.

Thus, processes have been described for relieving the strain in an n-channel transistor which uses a SiGe source/drain. This allows the advantages of a SiGe formed silicide to be used both on the p-channel and n-channel transistors.

What is claimed is:

1. A method for fabricating n-channel and p-channel transistors comprising:
   forming recesses in a silicon substrate for source and drain regions adjacent to gate structures for n-channel and p-channel transistors;
   growing SiGe in the recesses to form source and drain regions for the n-channel and p-channel transistors; and
   relieving strain in channel regions of the n-channel transistors resulting from growing the SiGe, without substantially affecting the strain in channel regions of the p-channel transistors by etching a dielectric material from isolation trenches disposed on one side of the source region and one side of the drain region of the n-channel transistors.

2. The method defined by claim 1, wherein not all the dielectric in all the trenches is etched.

3. The method defined by claim 1, including forming a silicide metal on the source and drain regions.

4. The method defined by claim 3, wherein the suicide metal comprises nickel.

5. A method for forming an n-channel transistor comprising:
   forming isolation trenches filled with a dielectric material in a silicon substrate;
   growing SiGe epitaxial source and drain regions in recesses formed in the substrate adjacent to the isolation trenches;
   etching the dielectric material from at least part of the trenches so as to relax strain in the SiGe source and drain regions; and
   forming a suicide metal on the source and drain regions.

6. The method defined by claim 5, wherein the silicide is formed using nickel.

7. The method defined by claim 6, wherein the dielectric material in the trenches is silicon dioxide.

8. The method defined by claim 5, including masking a part of at least one of the trenches such that the masked part of the trench is not etched when an exposed part of the trench is etched.

* * * * *